United States Patent [19]

Erdelyi et al.

[11] Patent Number: 4,952,818
[45] Date of Patent: Aug. 28, 1990

[54] TRANSMISSION LINE DRIVER CIRCUITS

[75] Inventors: Charles K. Erdelyi, Essex Junction, Vt.; Timothy P. Reed, Cary, N.C.

[73] Assignee: International Business Machines Corporation, Armonk, N.Y.

[21] Appl. No.: 353,378

[22] Filed: May 17, 1989

[51] Int. Cl.$^5$ .................. H03K 17/16; H03K 19/017; H03K 19/21

[52] U.S. Cl. ...................... 307/270; 307/443; 307/448; 307/451; 307/471; 307/473

[58] Field of Search ............... 307/443, 448, 451, 471, 307/473, 270

[56] References Cited

U.S. PATENT DOCUMENTS

| | | | |
|---|---|---|---|
| T. 955,006 | 2/1977 | Cavaliere et al. | 307/251 |
| 4,518,873 | 5/1985 | Suzuki et al. | 307/451 |
| 4,542,310 | 9/1985 | Ellis et al. | 307/578 |
| 4,612,466 | 9/1986 | Stewart | 307/585 |
| 4,721,866 | 1/1988 | Chi et al. | 307/451 |
| 4,804,867 | 2/1989 | Okitaka et al. | 307/473 |
| 4,818,901 | 4/1989 | Young et al. | 307/451 |

OTHER PUBLICATIONS

IBM Tech. Disc. Bul. "FET Current Driver Having Large Dynamic Range" Concannon et al. vol. 25, No. 7A 12/82.

Primary Examiner—Stanley D. Miller
Assistant Examiner—Margaret Rose Wambach
Attorney, Agent, or Firm—Stephen J. Limanek

[57] ABSTRACT

A driver circuit is provided which includes an output stage having first and second transistors and an output terminal, the first transistor being of a first type conductivity is coupled from the output terminal to a first point of reference potential and the second transistor being of a second type conductivity is coupled from the output terminal to a second point of reference potential. A first voltage divider includes transistors of the first type conductivity and a second voltage divider includes transistors of the second type conductivity. A second transistor of the first type conductivity is connected between the first point of reference potential and a control electrode of the first transistor of the first type conductivity and a second transistor of the second type conductivity is connected between the second point of reference potential and a control electrode of the first transistor of the second type conductivity. An input terminal and the output terminal are connected to the first and second voltage dividers, with an output from the first divider being connected to the control electrode of the first transistor of the second type conductivity and with an output of the second divider being connected to the control electrode of the first transistor of the first type conductivity. Transistors of the first and second type conductivities are preferably P-channel and N-channel field effect transistors, respectively.

22 Claims, 2 Drawing Sheets

TRANSMISSION LINE DRIVER CIRCUITS

DESCRIPTION

1. Technical Field

This invention relates to driver circuits and, more particularly, to push-pull type driver circuits made in the complementary metal oxide semiconductor (CMOS) technology which are connected to off chip networks or circuits such as transmission lines with the objective of having little or no impedance mismatch between a driver circuit and an interconnected transmission lines.

2. Background Art

Known CMOS driver or buffer circuits produce relatively large impedance variations at their outputs as result of the way in which the devices or transistors in the output stage of the driver circuit are controlled and due to process, temperature and power supply voltage variations. When these driver circuits are connected to transmission lines, impedance mismatching occurs which produces significant voltage reflections and voltage overshoot and undershoot problems. In such situations the system performance is adversely affected.

In the prior art, U.S. Pat. No. 4,612,466, filed Aug. 31, 1984, discloses a CMOS driver circuit having amplifying means and feedback means coupled between an output stage and the amplifying means for altering the signal transfer characteristics of the amplifying means as a function of the output voltage of the output stage for increasing the speed of response of the circuit.

In commonly assigned U.S. Pat. No. 4,542,310, filed by W. F. Ellis, W. R. Griffin and R. R. Troutman on June 29, 1983, there is disclosed a CMOS driver circuit which includes a pull-up transistor and a precharged bootstrap capacitor which discharges fully to the control electrode of the pull-up transistor for faster operation and improved efficiency.

U.S. Defensive Publication No. T955,006, published by J. R. Cavaliere and D. B. Eardley on Feb. 1, 1977, discloses a delay circuit wherein feedback is provided from an output of the circuit to P-channel and N-channel transistors for controlling a CMOS output inverter.

IBM Technical Disclosure Bulletin, vol. 25, No. 7A, December 1982, page 3505, discloses a driver having first and second depletion devices acting as a voltage divider to provide an optimized operating voltage for a pull-down device of the driver. The pull-down device provides positive feedback from the output stage of the driver to the control electrode of one of the first and second depletion devices. The variable voltage at the drain of the pull-down device is converted into a variable current by adding another depletion device in series with an output load.

DISCLOSURE OF THE INVENTION

It is an object of this invention to provide simpler, high performance driver circuits having improved tolerance of the precision of the driving impedance by appropriately controlling the channel resistance of the devices of the output stages of the driver circuits.

In accordance with the teachings of this invention, a driver circuit is provided which includes a voltage supply source having first and second points of reference potential and an output stage including an output terminal and a first transistor of a first type conductivity coupled between the first and second points of reference potential, with the first transistor being coupled between the output terminal and one of the first and second points of reference potential. A voltage divider having second and third transistors is also coupled between the first and second points of reference potential, with each of the second and third transistors being of a second type conductivity. The common point between the second and third transistors is connected to a control electrode of the first transistor, an input terminal is connected to a control electrode of the second transistor and the output terminal is connected to a control electrode of the third transistor.

In a push-pull arrangement of the driver circuit of this invention, the output stage also includes a fourth transistor of the second type conductivity coupled between the output terminal and the other point of reference potential and the driver circuit further includes a second voltage divider having fifth and sixth transistors, each of the first type conductivity, coupled between the first and second points of reference potential. The common point between the fifth and sixth transistors is connected to a control electrode of the fourth transistor, the input terminal is connected to a control electrode of the fifth transistor and the output electrode is connected to a control electrode of the sixth transistor.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
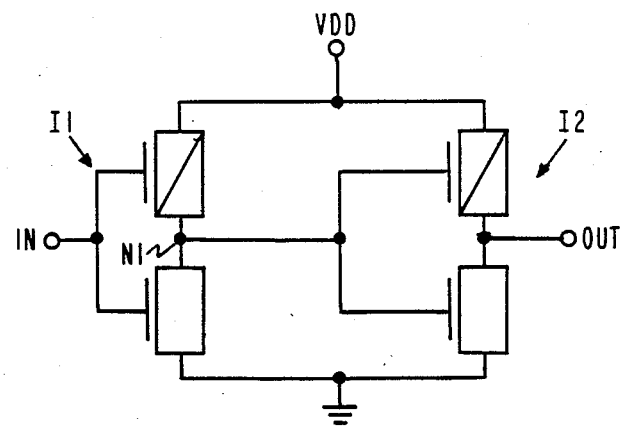
FIG. 1 is a circuit diagram of a known CMOS driver or buffer circuit using a pair of inverters.

Referring to FIG. 1 of the drawings in more detail, there is shown a circuit diagram of a known driver or buffer circuit made in the CMOS technology. The CMOS circuits in the drawings have P-channel field effect transistors indicated by a rectangle with a diagonal line formed within the rectangle and a gate or control electrode arranged as a line adjacent and parallel to one side of the rectangular, and N-channel field effect transistors indicated simply by a rectangle without the diagonal line and a gate or control electrode arranged adjacent to one side of the rectangle.

The known driver or buffer circuit illustrated in FIG. 1 includes an input terminal IN and a first CMOS inverter I1 having serially arranged P-channel and N-channel field effect transistors connected to a voltage supply source having a first point of reference potential as a positive voltage terminal VDD and a second point of reference potential as ground, with the N-channel field effect transistor being disposed between the P-channel field effect transistor and ground. An output identified as node N1 is at the common point between the two transistors. The known driver circuit also includes a second CMOS inverter I2 having serially arranged P-channel and N-channel field effect transistors coupled between the first and second points of reference potential with an input thereof connected to the output node N1 of the first inverter I1 and with an output of the second inverter I2 connected an output terminal OUT.

As is known, this prior art CMOS driver circuit has relatively large variations in its output impedance due to the manner in which the P-channel and N-channel field effect transistors of the second or output inverter I2 are controlled and due to the process, temperature and power supply voltage variations. The graph of FIG. 3 of the drawings indicates by a dash line A the known driver output impedance variations as plotted against the external voltage applied to a transmission line connected to the output terminal OUT when the voltage at the input terminal IN is at 0 volts or ground. It is assumed in this case that the transmission line has a 40 ohm impedance and that the known driver circuit of FIG. 1 has been designed to have a matching output impedance of 40 ohms. It can be seen from FIG. 3 that in the known driver circuit its output impedance matches the transmission line impedance only when the external voltage applied to the transmission line is at approximately 3.5 volts. When the 40 ohm transmission line voltage is at 0 volts, the output impedance of the known driver circuit is at approximately only 30 ohms, resulting in an impedance mismatch between the transmission line and the known driver circuit which causes unwanted voltage reflections in the transmission line. This low output impedance in the known driver circuit is due to a high voltage at the gate of the N-channel device of the second inverter I2 compared with the low voltage on the transmission line and at the drain of this N-channel device. It can also be seen from curve A of FIG. 3 that when the 40 ohm transmission line voltage is at +5 volts, the output impedance of the known driver circuit is as high as about 50 ohms, again resulting in an impedance mismatch between the transmission line and the known driver circuit which also causes unwanted reflections in the transmission line. This high output impedance in the known driver circuit is due to a high voltage at the gate of the N-channel device of the second inverter I2 and an equally high voltage on the transmission line and at the drain of this N-channel device.

Figure 4:
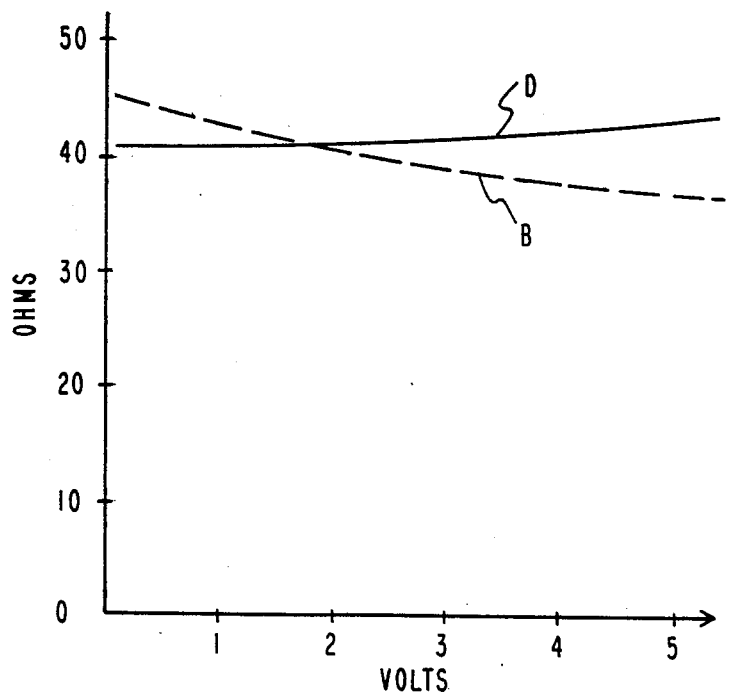
FIG. 4 is a graph indicating driver output impedances while holding an up level.

The graph of FIG. 4 of the drawings indicates by a dash line B the known driver output impedance variations as plotted against the external voltage applied to a transmission line connected to the output terminal OUT when the voltage at the input terminal IN is at +5 volts. It is again assumed in this case that the transmission line has a 40 ohm impedance and that the known driver circuit of FIG. 1 has been designed to have an output impedance of 40 ohms. It can be seen that in the known driver circuit its output impedance matches the transmission line impedance only when the external voltage applied to the transmission line is at approximately 2 volts. When the 40 ohm transmission line voltage is at 0 volts, the output impedance of the known driver circuit is as high as approximately 45 ohms, resulting in an impedance mismatch between the transmission line and the known driver circuit which causes unwanted reflections in the transmission line. This high output impedance in the known driver circuit is due to a low voltage at the gate of the N-channel device of the second inverter I2 and an equally low voltage on the transmission line and at the drain of this N-channel device. It can also be seen from curve B of FIG. 4 that when the 40 ohm transmission line voltage is at +5 volts, the output impedance of the known driver circuit is down to approximately 35 ohms, resulting in an impedance mismatch between the transmission line and the known driver circuit which again causes unwanted reflections in the transmission line. This low output impedance in the known driver circuit is due to a low voltage at the gate of the N-channel device of the second inverter I2 compared with the high voltage on the transmission line and at the drain of this N-channel device. Accordingly, it can be seen that driver or buffer circuits of the type illustrated in FIG. 1 of the drawings can not be used satisfactorily in high performance circuitry.

Figure 2:
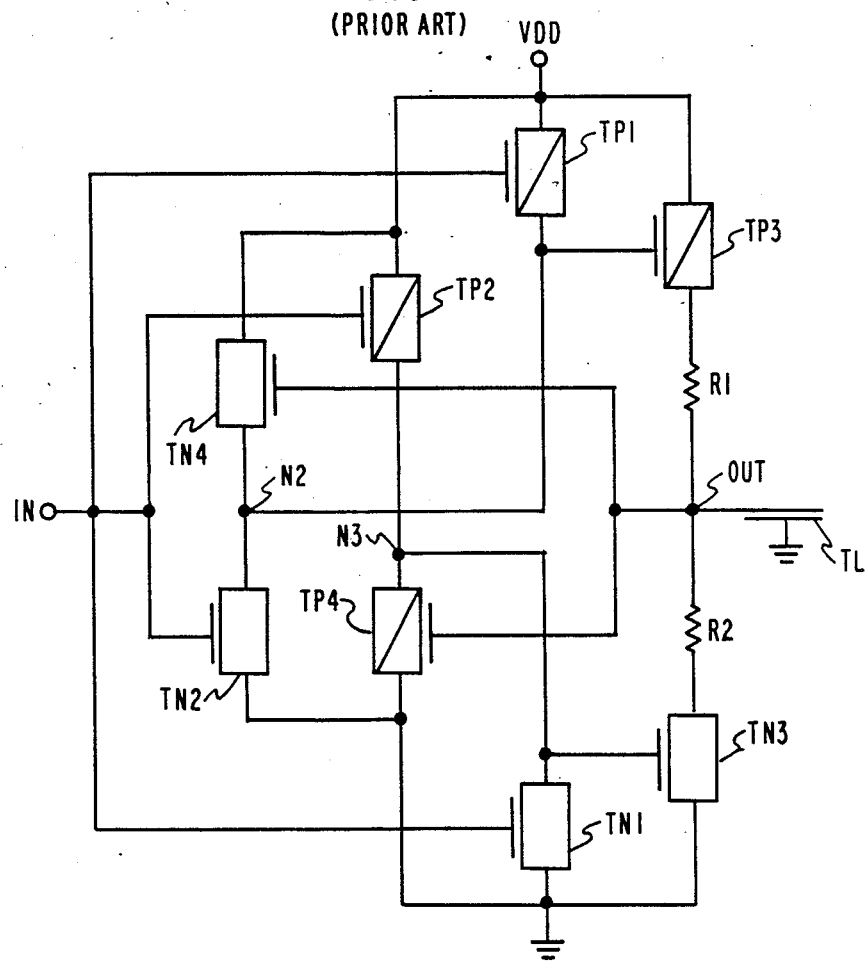
FIG. 2 is a circuit diagram of a preferred embodiment of a CMOS driver circuit of the present invention.

In FIG. 2 of the drawings there is shown a circuit diagram of the preferred embodiment of the driver circuit of the present invention which provides a substantially constant output impedance over a large range of external voltages applied to the interconnected transmission line.

The driver circuit of FIG. 2 is made in the CMOS technology and includes first, second and third P-channel field effect transistors TP1, TP2 and TP3, respectively, each having a source connected to a positive voltage terminal VDD of a voltage supply source having a voltage between approximately +4.5 and +5.5 volts, (preferably +5 volts), and first, second and third N-channel field effect transistors TN1, TN2 and TN3, respectively, each having a source connected to a point of reference potential of the voltage supply source, preferably ground. A fourth P-channel field effect transistor TP4 is connected between the drain of the second P-channel transistor TP2 and ground and a fourth N-channel field effect transistor TN4 is connected between the drain of the second N-channel transistor TN2 and the voltage supply terminal VDD. The second and fourth P-channel transistors TP2 and TP4 form a first voltage divider connected between the terminals VDD and ground, and the second and fourth N-channel transistors TN2 and TN4 form a second voltage divider which is also connected between the terminals VDD and ground. The first and second voltage dividers are used as a driver limiting block to control the voltage at the control electrodes of the third P-channel and N-channel transistors TP3 and TN3. The common point N2 between the second and fourth N-channel transistors TN2 and TN4 is connected to a control electrode of the third P-channel transistor TP3 and to the drain of the first P-channel transistor TP1, and the common point N3 between the second and fourth P-channel transistors TP2 and TP4 is connected to a control electrode of the third N-channel transistor TN3 and to the drain of the first N-channel transistor TN1. An input terminal IN is connected to a control electrode of the first and of the second P-channel transistors TP1 and TP2 and to a control electrode of first and of second N-channel transistors TN1 and TN2. An output terminal OUT is connected to the drain of the third P-channel transistor TP3 through a first load resistor R1 and to the drain of the third N-channel transistor TN3 through a second load resistor R2. The transistors TP3 and TN3 and the resistors R1 and R2, along with the output terminal OUT, form the output stage of the driver circuit. A transmission line TL having, e.g., a 40 ohm characteristic impedance, is connected to the output terminal OUT.

Figure 3:
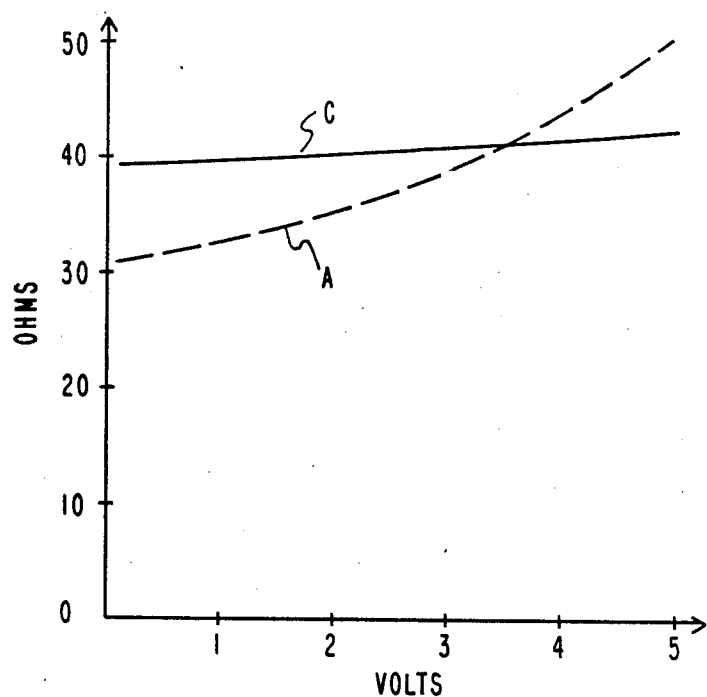
FIG. 3 is a graph indicating driver output impedances while holding a down level.

By referring to the solid line C of the graph of FIG. 3 of the drawings, it can be seen that by designing the transistors or device of the driver circuit of FIG. 2 for a 40 ohm output impedance to match the 40 ohm impedance of the transmission line TL, the output impedance of the driver circuit of the present invention remains very constant over a large range of external voltage applied to the transmission line TL when the input voltage at the terminal IN is at 0 volts or at ground. More specifically, it can be seen from curve C that at zero external volts the output impedance of the driver circuit of the present invention is at approximately 39 ohms and, thereafter, to an external voltage of +5 volts, the output impedance increases to no more than about 40 ohms. Likewise, when the input voltage at the terminal IN is at +5 volts, the output impedance of the driver circuit of the present invention remains very constant over a large range of external voltages applied to the transmission line TL, as indicated by the solid line D in the graph of FIG. 4 of the drawings. More specifically, it can be seen from curve D that at zero external volts the output impedance of the driver circuit of the present invention is at approximately 41 ohms and, thereafter, the output impedance decreases to approximately 40 ohms and remains at approximately 40 ohms until it again rises slightly to about 41 ohms at +5 volts of externally applied voltage. Accordingly, it can be seen that the output impedance of the driver circuit of the present invention when designed at, said 40 ohms closely matches the characteristic impedance of a 40 ohm transmission line over a large range of externally applied voltages to the transmission line regardless of whether the voltage at the input terminal IN is at 0 volts representing a 0 binary digit or at +5 volts representing a 1 binary digit. Thus, it should be noted that the interconnection of a 40 ohm transmission line to the output of the driver circuit of the present invention produces only minor, if any, unwanted voltage reflection in the transmission line, providing a very high performance circuit.

It should be understood that in order to provide the constant output impedance at the output of the driver circuit of the present invention the voltages at the control electrodes or gates of the P-channel and N-channel transistors TP3 and TN3, respectively, of the output stage of the driver circuit must be appropriately controlled when the devices are conducting. The nature of the controls is such that the voltage at the gates of the P-channel and N-channel transistors TP3 and TN3 needs to track the voltage at the drains of the P-channel and N-channel transistors TP3 and TN3, providing a constant voltage difference between the voltage at the control electrode or gate and the voltage at the drain of each of these output transistors TP3 and TN3, except for compensative variations. The voltage across P-channel transistor TP4 having its control electrode connected to the output terminal OUT limits the drive at the control electrode of the output N-channel transistor TN3. Likewise, the voltage across N-channel transistor TN4 having its control electrode connected to the output terminal OUT limits the drive at the control electrode of the output P-channel transistor TP3. It should be particularly noted that the voltages on the control electrodes of these output transistors TN3 and TP3 are carefully controlled when these transistors TN3 and TP3 are conducting.

For a better understanding of this invention reference should be had to the following simplified equations:

$$Ids = B \times (Vgs - Vt - Vds/2) \times Vds,$$

where Ids is the current flowing through the N-channel transistor TN3, B, sometimes referred to as beta, is equal to the width/length ratio of transistor TN3 times gamma or the transconductance of transistor TN3, which is a constant, Vgs is the voltage between the gate or control electrode and source of the transistor TN3, Vt is the threshold voltage of transistor TN3 and Vds is the voltage between the drain and source of the transistor TN3; then $$dIds/dVds = B(Vgs - Vt - Vds);$$

and $$Rds = dVds/dIds = 1/(B(Vgs - Vt - Vds)),$$

where Rds is the resistance between the drain and source of the transistor TN3, which is the inverse of the transconductance.

The resistance Rds can be made nearly constant in the region of $Vgs \pi Vt + Vds$ by making B and $Vgs - (Vt + Vds)$ nearly constant.

When the driver circuit of the present invention is in the pull-down state, the various components assume the following roles:

transistor TP2 is turned on and pulls up the gate or control electrode of the transistor TN3, transistor TP4 is the device that limits how high the voltage at the gate of the transistor TN3 can rise, depending upon the voltage at the output terminal OUT, transistor TN3 is the pull-down device whose channel resistance is being controlled, and second resistor R2 is a resistor provided to sample the output current and, thereby, to generate a voltage component for controlling the feedback through the gate of the transistor TP4 together with the source-drain voltage of transistor TN3.

The N-channel transistors TN2 and TN4 and first resistor R1 function in a similar manner with the P-channel transistor TP3 when the driver circuit of the present invention is in the pull-up state.

In the operation of the driver circuit of FIG. 2 of the drawings, when a low voltage such as zero volts is applied to the input terminal IN, the first N-channel transistor TN1 is turned off and the P-channel transistor TP1 and TP2 are turned on, thus, the output P-channel transistor TP3 is turned off and the output N-channel transistor TN3 is turned on fully as long as the voltage at the output terminal OUT is sufficiently high to maintain transistor TP4 in an off condition. As the voltage at the output terminal OUT drops below the supply voltage VDD by more than the threshold voltage of the P-channel transistor TP4, the transistor TP4 begins to conduct, which causes a reduction in the voltage at the gate of the output N-channel transistor TN3. It is from this time on that the resistance of the output N-channel transistor TN3 is carefully controlled to maintain the matching impedance. The voltage applied to the gate of the output N-channel transistor TN3 is some nearly constant value above the voltage at the output terminal OUT but it is a function of the threshold voltage of the P-channel transistor TP4 and through this also a function of temperature and process conditions. Through appropriate selection of the dimensions of the P-channel and N-channel transistors and of resistor R2, the desired value of output resistance can be provided so that the drive voltage on the control electrode is proportional to the current passing through the N-channel transistor TN3.

In particular implementations, 40, 80 and 600 ohm resistances have been analyzed. In these analyses the output resistance has been found to remain linear within ±2% in the output range of 0 to 3 volts as long as temperature, supply voltage and process assumptions are maintained constant. Under similar conditions, the resistance of output field effect transistors in known driver circuits such as the driver circuit illustrated in FIG. 1 of the drawings varies by approximately ±34%.

A summary of the variations of resistance R as a function of temperature T, process NRN and supply voltage VDD, with the output voltage being between 0 and 3 volts is as follows:

Temperature T dependence at VDD = +5 volts and a normal process NRN=0.5, where NRN represents the nominal random number as conventionally used in the semiconductor process modeling art to designate certain point on statistical distributions. A low number below 0.5 indicating a fast process and a high number above 0.5 indicating a slow process:

| T | 20° C. | 55° C. | 80° C. |
|---|--------|--------|--------|
| R | .85 Ro | Ro     | 1.1 Ro | where Ro is a nominal value of resistance at 55° C.

In the known driver circuits of the type illustrated in FIG. 1 of the drawings, the usual biasing of the output transistor in the latter situation results in a resistance variation from 0.52 Ro to 1.4 Ro when the output voltage is between 0 and 3 volts.

Process NRN dependence at VDD = +5 volts and T=55° C.:

| NRN | .06567 | .5  | .909    |
|-----|--------|-----|---------|
| R   | .85    | Ro  | 1.15 Ro |

In the known driver circuits of the type illustrated in FIG. 1, the usual biasing of the output transistor in the latter situation results in a resistance variation from 0.52 Ro to 1.5 Ro when the output voltage is between 0 and 3 volts.

Power supply VDD dependance at T=55° C. and the NRN=0.5:

| VDD | 5.5    | 5   | 4.5    |
|-----|--------|-----|--------|
| R   | .95 Ro | Ro  | 1.1 Ro |

In the known driver circuits of the type illustrated in FIG. 1, the usual biasing of the output transistor in the latter situation results in a resistance variation from 0.56 Ro to 1.52 Ro when the output voltage is between 0 and 3 volts.

With extreme conditions occurring simultaneously:

| T   | 20° C.  | 55° C. | 85° C. |
|-----|---------|--------|--------|
| NRN | .06567  | .5     | .909   |
| VDD | 5.5     | 5      | 4.5    |
| R   | .72 Ro  | Ro     | 1.4 Ro |

In the known driver circuits of the type illustrated in FIG. 1, the usually biasing of the output transistor in the latter situation results in a resistance variation from 0.4 Ro to 1.9 Ro when the output voltage is between 0 and 3 volts.

Accordingly, it can be seen that a high performance driver circuit of the push-pull type has been provided having a nearly constant output impedance which matches the impedance of a given transmission line over a wide range of voltages by appropriately controlling the devices, components or transistors of the output stage of the driver. Furthermore, the driver circuit can have, as desired, a relatively low constant output impedance of, e.g., 40 ohms or less, or a high impedance of, e.g., 600 ohms or more, to match a corresponding impedance of a transmission line over a relatively large range of voltages.

While the invention has been particularly shown and described with reference to preferred embodiments thereof, it will be understood by those skilled in the art that various changes in form and details may be made therein without departing from the spirit and scope of the invention.

What is claimed is:

1. A driver circuit comprising
   first and second points of reference potential,
   an output circuit including an output terminal and a first transistor of one conductivity type coupled between said first and second points of reference potential, said transistor being disposed between said output terminal and one of said first and second points of reference potential,
   a voltage divider including serially arranged second and third transistors coupled between said first and second points of reference potential, respectively, each of said second and third transistors being of a conductivity type opposite to that of said first transistor, the common point between said second and third transistors being coupled to a control electrode of said first transistor,
   means for applying an input to a control electrode of said third transistor, and
   means for coupling said output terminal to a control electrode of said second transistor.

2. A driver circuit as set forth in claim 1 wherein said output circuit further includes an impedance disposed between said first transistor and said output terminal.

3. A driver circuit as set forth in claim 2 wherein said impedance is a resistor.

4. A driver circuit as set forth in claim 1 wherein said first, second and third transistors are field effect transistors.

5. A driver circuit as set forth in claim 1 wherein said first transistor is disposed between said output terminal and said second point of reference potential and said third transistor is disposed between said second point of reference potential and said second transistor.

6. A driver circuit as set forth in claim 1 wherein said first transistor is disposed between said output terminal and said first point of reference potential and said third transistor is disposed between said first point of reference potential and said second transistor.

7. A driver circuit comprising
   first and second points of reference potential,
   an output circuit including an output terminal and a first transistor of one conductivity type coupled between said first and second points of reference potential, said transistor being disposed between said output terminal and one of said first and second points of reference potential, a voltage divider including second and third transistors coupled between said first and second points of reference potential, respectively, each of said second and third transistors being a conductivity type opposite to that of said first transistor, the common point between said second and third transistors being coupled to a control electrode of said first transistor, said first transistor being an N-channel field effect transistor and said second and third transistors being P-channel field effect transistors, means for applying an input voltage to a control electrode of said third transistor, and means for coupling said output terminal to a control electrode of said second transistor.

8. A driver circuit as set forth in claim 7 wherein said first transistor is a P-channel field effect transistor and said second and third transistors are N-channel field effect transistors.

9. A driver circuit comprising a source of supply voltage having first and second points of reference potential, an output circuit including an output terminal and first and second transistors, said first transistor being of a first type conductivity and disposed between said output terminal and said first point of reference potential and said second transistor being of a second type conductivity and disposed between said output terminal and said second point of reference potential, a first voltage divider including serially arranged third and fourth transistors disposed between said first and second points of reference potential, each of said third and fourth transistors being of said second type conductivity, the common point between said third and fourth transistors being coupled to a control electrode of said first transistor, a second voltage divider including serially arranged fifth and sixth transistors disposed between said first and second points of reference potential, respectively, each of said fifth and sixth transistors being of said first type conductivity, the common point between said fifth and sixth transistors being coupled to a control electrode of said second transistor, means for applying an input voltage to a control electrode of said fourth transistor and to a control electrode of said fifth transistor, and means for coupling said output terminal to a control electrode of said third transistor and to a control electrode of said sixth transistor.

10. A driver circuit as set forth in claim 9 wherein each of said transistors is a field effect transistor.

11. A driver circuit as set forth in claim 9 further including a transmission line connected to said output terminal.

12. A driver circuit comprising a voltage source having a first terminal at a given voltage and a second terminal at a reference potential, an output circuit including a first N-channel field effect transistor, a first P-channel field effect transistor and an output terminal, said first P-channel field effect transistor being coupled between said first terminal and said output terminal and said first N-channel field effect transistor being coupled between said second terminal and said output terminal, an input terminal, second and third serially connected P-channel field effect transistors coupled between said first and second terminal, said second P-channel field effect transistor having a control electrode connected to said input terminal and said third P-channel field effect transistor having a control electrode connected to said output terminal, the common point between said second and third P-channel field effect transistor being connected to a control electrode of said first N-channel field effect transistor, second and third serially connected N-channel field effect transistors coupled between said first and second terminals, said second N-channel field effect transistor having a control electrode connected to said input terminal and said third N-channel field effect transistor having a control electrode connected to said output terminal, the common point between said second and third N-channel field effect transistor being connected to a control electrode of said first P-channel field effect transistor, a fourth P-channel field effect transistor connected between said first terminal and the control electrode of said first P-channel field effect transistor and having a control electrode connected to said input terminal, and a fourth N-channel field effect transistor connected between said second terminal and the control electrode of said first N-channel field effect transistor and having a control electrode connected to said input terminal.

13. A driver circuit as set forth in claim 12 wherein said output circuit further includes first and second resistors, said first resistor being connected between said first P-channel field effect transistor and said output terminal and said second resistor being connected between said first N-channel field effect transistor and said output terminal.

14. A driver circuit as set forth in claim 12 further including a transmission line connected to said output terminal.

15. A driver circuit comprising a voltage source having first and second points of reference potential, an input terminal, an output terminal, a first P-channel field effect transistor coupled between said first point of reference potential and said output terminal, a first N-channel field effect transistor coupled between said second point of reference potential and said output terminal, drive limiting block means having an input, first and second outputs and a feedback terminal coupled between said first and second points of reference potential, said input being connected to said input terminal, said first output being connected to a control electrode of said first P-channel field effect transistor, said second output being connected to a control electrode of said first N-channel field effect transistor and said feedback terminal being connected to said output terminal, a second P-channel field effect transistor connected between said first point of reference potential and the control electrode of said first P-channel field effect transistor and said input terminal being connected to a control electrode of said second P-channel field effect transistor, and a second N-channel field effect transistor connected between said first point of reference potential and the control electrode of said first N-channel field effect transistor and said input terminal being connected to a control electrode of said second P-channel field effect transistor.

16. A driver circuit as set forth in claim 15 wherein said drive limiting block means includes
a first voltage divider including third and fourth N-channel field effect transistors, and
a second voltage divider including third and fourth P-channel field effect transistors,
the control electrode of said first P-channel field effect transistor being connected to said first voltage divider and the control electrode of said first N-channel field effect transistor being connected to said second voltage divider,
said input of said drive limiting block means being connected to a control electrode of said third N-channel field effect transistor and to a control electrode of said third P-channel field effect transistor, and said feedback terminal of said drive limiting block means being connected to a control electrode of said fourth N-channel field effect transistor and to a control electrode of said fourth P-channel field effect transistor.

17. A driver circuit comprising
first and second points of reference potential,
an output circuit including an output terminal and a first transistor of one conductivity type coupled between said first and second points of reference potential, said transistor being disposed between said output terminal and said first point of reference potential,
a voltage divider including second and third transistors coupled between said first and second points of reference potential, respectively, with said third transistor being disposed between said first point of reference potential and said second transistor, each of said second and third transistors being a conductivity type opposite to that of said first transistor, the common point between said second and third transistors being coupled to a control electrode of said first transistor, said first transistor being an N-channel field effect transistor and said second and third transistors being P-channel field effect transistors,
means for applying an input voltage to a control electrode of said third transistor, and
means for coupling said output terminal to a control electrode of said second transistor.

18. A driver circuit comprising
first and second points of reference potential,
an output circuit including an output terminal and a first transistor of one conductivity type coupled between said first and second points of reference potential, said transistor being disposed between said output terminal and said first point of reference potential,
a voltage divider including second and third transistors coupled between said first and second points of reference potential, respectively, said third transistor being disposed between said second point of reference potential and said second transistor, each of said second and third transistors being of a conductivity type opposite to that of said first transistor, the common point between said second and third transistors being coupled to a control electrode of said first transistor, said first transistor being a P-channel field effect transistor and said second and third transistors being N-channel field effect transistors,
means for applying an input voltage to a control electrode of said third transistor, and
means for coupling said output terminal to a control electrode of said second transistor.

19. A driver circuit comprising
a source of supply voltage having first and second points of reference potential,
an output circuit including an output terminal, first and second transistors, said first transistor being of a first type conductivity and disposed between said output terminal and said first point of reference potential and said second transistor being of a second type conductivity and disposed between said output terminal and said second point of reference potential, and first and second impedances, said first impedance being disposed between said first transistor and said output terminal and said second impedance being disposed between said second transistor and said output terminal,
a first voltage divider including third and fourth transistors disposed between said first and second points of reference potential, each of said third and fourth transistors being of said second type conductivity, the common point between said third and fourth transistors being coupled to a control electrode of said first transistor,
a second voltage divider including fifth and sixth transistors disposed between said first and second points of reference potential, respectively, each of said fifth and sixth transistors being of said first type conductivity, the common point between said first and sixth transistors being coupled to a control electrode of said second transistor,
means for applying an input voltage to a control electrode of said fourth transistor and to a control electrode of said fifth transistor, and
means for coupling said output terminal to a control electrode of said third transistor and to a control electrode of said sixth transistor.

20. A driver circuit comprising
a source of supply voltage having first and second points of reference potential,
an output circuit including an output terminal, first and second transistors, said first transistor being an N-channel field effect transistor and disposed between said output terminal and said first point of reference potential and said second transistor being a P-channel field effect transistor and disposed between said output terminal and said second point of reference potential, and first and second impedances, said first impedance being disposed between said first transistor and said output terminal and said second impedance being disposed between said second transistor and said output terminal,
a first voltage divider including third and fourth transistors disposed between said first and second points of reference potential, each of said third and fourth transistors being P-channel field effect transistors, the common point between said third and fourth transistors being coupled to a control electrode of said first transistor,
a second voltage divider including fifth and sixth transistors disposed between said first and second points of reference potential, respectively, each of said fifth and sixth transistors being N-channel field effect transistors, the common point between said first and sixth transistors being coupled to a control electrode of said second transistor, means for applying an input voltage to a control electrode of said fourth transistor and to a control electrode of said fifth transistor, and means for coupling said output terminal to a control electrode of said third transistor and to a control electrode of said sixth transistor.

21. A driver circuit comprising a source of supply voltage having first and second points of reference potential, an output circuit including an output terminal and first and second transistors, said first transistor being of a first type conductivity and disposed between said output terminal and said first point of reference potential and said second transistor being of a second type conductivity and disposed between said output terminal and said second point of reference potential, a first voltage divider including third and fourth transistors disposed between said first and second points of reference potential, each of said third and fourth transistors being of said second type conductivity, the common point between said third and fourth transistors being coupled to a control electrode of said first transistor, a second voltage divider including fifth and sixth transistors disposed between said first and second points of reference potential, respectively, each of said fifth and sixth transistors being of said first type conductivity, the common point between said first and sixth transistors being coupled to a control electrode of said second transistor, means for applying an input voltage to a control electrode of said fourth transistor and to a control electrode of said fifth transistor, means for coupling said output terminal to a control electrode of said third transistor and to a control electrode of said sixth transistor, and a seventh transistor of said first type conductivity and an eight transistor of said second type conductivity, said seventh transistor being connected between the control electrode of said first transistor and said first point of reference potential and having a control electrode coupled to said input voltage applying means, and said eighth transistor being connected between the control electrode of said second transistor and said second point of reference potential and having a control electrode coupled to said input voltage applying means.

22. A driver circuit as set forth in claim 21 wherein said first, fifth, six and seventh transistors are N-channel field effect transistors and said second, third, fourth and eighth transistors are P-channel field effect transistors.

* * * * *